United States Patent [19]

Fayfield

[11] Patent Number: 5,087,838
[45] Date of Patent: Feb. 11, 1992

[54] SOURCING OR SINKING OUTPUT CIRCUIT

[75] Inventor: Robert W. Fayfield, Shorewood, Minn.

[73] Assignee: Banner Engineering Corporation, Minneapolis, Minn.

[21] Appl. No.: 652,999

[22] Filed: Feb. 7, 1991

[51] Int. Cl.5 ............................. H03K 19/082
[52] U.S. Cl. ............................. 307/465; 307/236; 307/296.1; 307/445
[58] Field of Search ........... 340/310 R, 825.83, 445, 340/465–466, 236, 254, 262, 257, 296.1; 328/70

[56] References Cited

U.S. PATENT DOCUMENTS

| | | | |
|---|---|---|---|
| 2,866,909 | 12/1958 | Trousdale | 307/570 |
| 3,176,143 | 3/1965 | Lode | 328/70 |
| 3,278,757 | 10/1966 | Ragen | 307/570 |
| 3,566,145 | 2/1971 | Goodale | 307/236 X |
| 3,573,501 | 4/1971 | Diehl | 307/257 |
| 3,597,633 | 8/1971 | Hirano et al. | 307/257 |
| 4,482,818 | 11/1984 | Ryczek et al. | 307/296.1 X |
| 4,686,392 | 8/1987 | Lo | 307/445 X |
| 4,689,499 | 8/1987 | Yee | 307/236 X |
| 4,866,297 | 9/1989 | Matsumoto | 307/236 |
| 4,982,107 | 1/1991 | Fayfield | 307/236 |
| 5,021,689 | 6/1991 | Pickett et al. | 307/465 |
| 5,023,606 | 6/1991 | Kaplinsky | 340/825.83 X |

FOREIGN PATENT DOCUMENTS 1059685 11/1964 United Kingdom.
1285903 11/1969 United Kingdom.

*Primary Examiner*—David Hudspeth
*Attorney, Agent, or Firm*—Merchant, Gould, Smith, Edell, Welter & Schmidt

[57] ABSTRACT

A DC circuit for a sensor or control device is disclosed which has a primary output, and a secondary output which, at the option of the user, is either the complement of the primary output or an unrelated output signal such as an alarm signal. The user selects the mode of operation of the secondary output terminal by selecting the polarity of a supply voltage applied to the control device at two input terminals.

4 Claims, 1 Drawing Sheet

SOURCING OR SINKING OUTPUT CIRCUIT

FIELD OF THE INVENTION

This invention pertains to the field of electronic sensor and control devices and in particular to devices having outputs which provide either a complementary pair of outputs, or a primary output and an unrelated output.

BACKGROUND OF THE INVENTION

Electronic sensors and related control devices are widely used in the field of industrial controls. For example, photoelectric sensors are used for detecting the presence or absence of an object and for providing a signal or switching accordingly.

Binary sensors are those sensors in control devices whose outputs are always in one of two states, ON or OFF. This distinguishes them from sensors and control devices whose outputs are analog voltages or currents.

Binary sensors have traditionally been supplied with two outputs, each of which is complementary to the other. When one of the outputs is ON (conducting) the other output is OFF (non-conducting). One output causes operation of the load when, for example, the sensor sensed a product present, and the other output causes operation of the load when, in this example, the sensor sensed the absence of a product.

The increasing use of programmable logic controllers ("PLC's") and shop floor computers has somewhat obviated the need for complementary outputs, since computers may be easily programmed to create internally the complement of an input signal. Nonetheless, there are still many customers who prefer to buy sensors with complementary outputs, and manufacturers of sensors will need to supply complementary outputs for some time to come.

In addition to the increasing use of PLC's on the shop floor, customers are requesting alarm and warning functions built into the sensors to anticipate problems and initiate maintenance of the sensors. Thus, many new sensors are being supplied with a control output that represents the binary status of a sensor (ON or OFF), and a second alarm output that alerts the user to a sensor problem. In general, the Alarm Signal is also annunciated with an indicator on a sensor itself.

The present invention serves with the same device both the customer who wants complementary outputs and the customer who wants an alarm output. In general, those customers using a PLC will have many sensors in their system and will choose the alarm mode so that they can connect the alarm outputs into extra PLC input boards and thus monitor the alarm condition of each sensor. Those customers not using PLC's are more likely to need the complementary output and are willing to give up the alarm output, since they use very few sensors, and since the alarm condition is still annunciated on the sensor.

A device which serves both customers who want a current sourcing output and those who want a current sinking output is disclosed in U.S. Pat. No. 4,982,107, assigned to the assignee of the present invention and incorporated herein by reference. The user selects the output signal to be a sourcing or sinking current by the polarity of the supply voltage.

One solution to providing both complementary outputs and an alarm output in the same device would be to provide a circuit with a third output, such that the user had the sensor output, its complement, and the alarm output. Likewise, a switch could be used to select whether the secondary output was a complement or an alarm. Both of these solutions, however, require more and larger circuitry than the present invention. This would be undesirable in today's miniaturized sensors.

The present invention solves this problem by providing a circuit with two outputs, one of which is a primary output, representing the sensor signal and conducting when the sensor signal is present. The other output (secondary output) can be selected by the user to represent either the complement of the primary output or the status of the Alarm Signal, depending on the polarity of the DC supply voltage to the device. A diode bridge assures that the control circuitry receives voltage of the correct polarity regardless of the polarity of the supply voltage.

SUMMARY OF THE INVENTION

The present invention provides improvements in the design of sensors and control devices of the type described above through the use of a circuit having a primary output, and a secondary output which is either the complement of the primary output or the status of an unrelated signal, such as an alarm signal. The user selects the mode of operation for the secondary output by selecting the polarity of the supply voltage applied to the control device.

BRIEF DESCRIPTION OF THE DRAWING

In the drawing, where like numerals to like elements.

DETAILED DESCRIPTION OF THE PREFERRED EMBODIMENT

Figure 1:
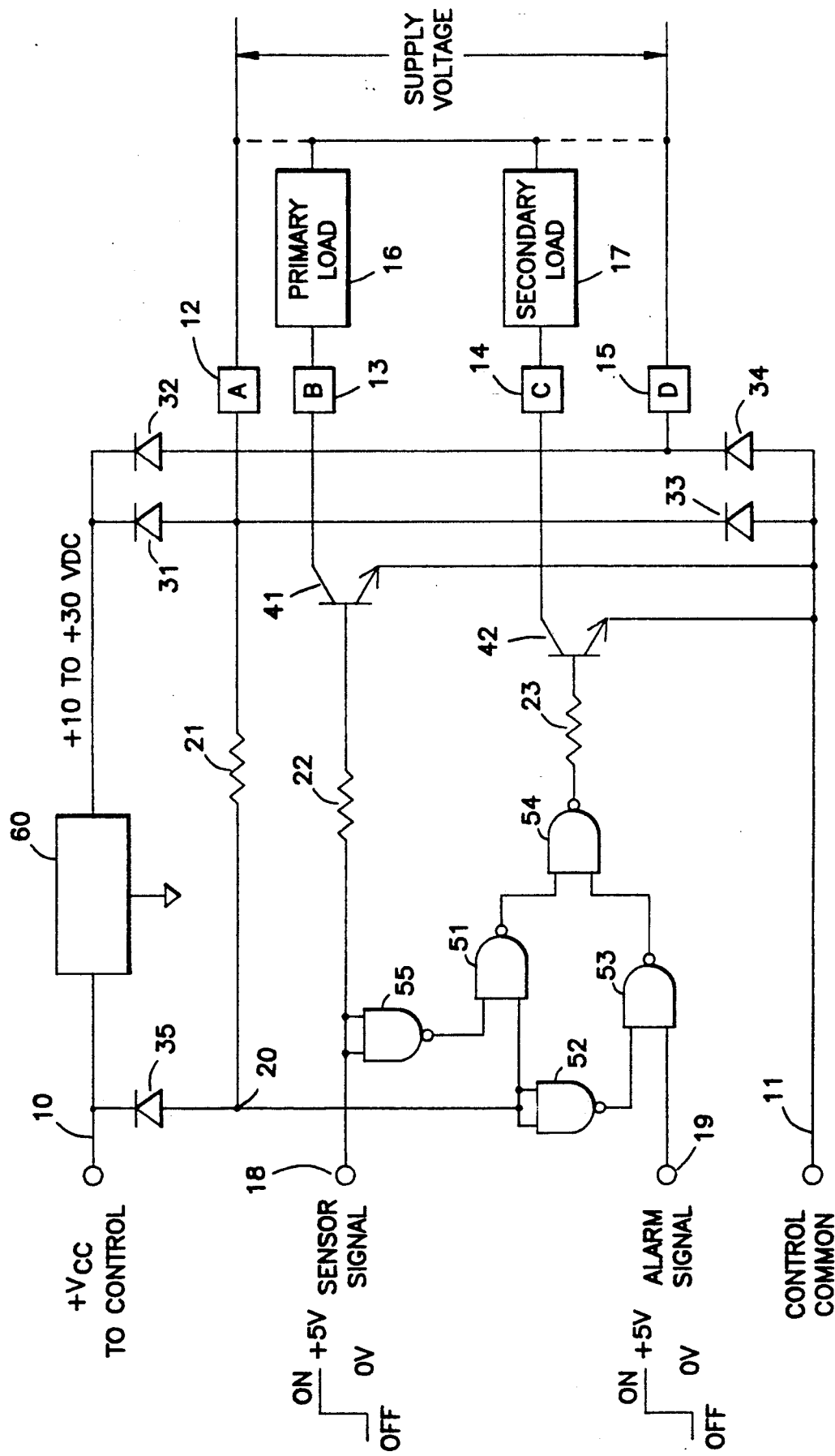
FIG. 1 is a schematic electrical diagram for the preferred embodiment of a circuit incorporating the present invention.

In the following detailed description of the preferred embodiment, reference is made to the accompanying drawing in which is shown by way of illustration a preferred embodiment in which the invention may be practiced. It is to be understood that other embodiments may be used without departing from the scope of the present invention.

The present invention, as embodied in the circuit of FIG. 1, provides for a primary output and a secondary output. The secondary output, at the selection of the user, is either the complement of the primary output or an unrelated output signal, such as an Alarm Signal, operating independent of the primary output. The user selection is made by the polarity of the supply voltage.

The sensor or control device (not shown) which incorporates the present invention, as embodied in FIG. 1, would be coupled to Vcc 10 and Control Common 11. The sensor or control device would also supply the logic signals Sensor Signal 18 and Alarm Signal 19. The Sensor Signal 18 is arbitrarily shown to be in a logic HIGH state when the sensor is deemed to be ON, or sensing a product or target, and in a logic LOW state when the sensor is deemed to be OFF, or not sensing a product or target. The Alarm Signal 19 is arbitrarily shown to be in a logic HIGH state when there is an alarm condition in the sensor, and in a logic LOW state when there is no alarm.

The connections to terminals 12-15 are made by the user. The user supplies a DC supply voltage of a value between 10 and 30 volts at terminals 12 and 15. The user would also connect a primary load 16 to terminal 13 and a secondary load 17 to terminal 14. The primary load 16 and secondary load 17 would also be connected to the positive side of the supply voltage, which could be either terminal 12 or 15. The primary and secondary loads may be, for example, relays, solenoids, or inputs to other logic circuits such as PLC's.

Diodes 31-34 constitute a bridge rectifier such that the sensor regulator 60 will receive voltage of the proper polarity regardless of the polarity of the supply voltage, as determined by the user, at terminals 12 and 15. Sensor regulator 60 is a three-terminal series regulator, such as the generic style "7800," which is well-known in the art.

The logic levels delivered to the primary load 16 and secondary load 17 are provided by transistors 41 and 42 respectively. Transistor 41 is the primary output transistor, and transistor 42 is the secondary output transistor. While transistors 41 and 42 are shown as NPN devices, one skilled in the art will recognize that transistors 41 and 42 could be PNP devices, relays, optical couplers, field effect transistors ("FET's"), or other switching devices.

Resistors 22 and 23 are current limiting resistors which are used to control the amount of current fed to the bases of transistors 41 and 42 respectively.

Gates 51-55 are NAND gates which are used in controlling the mode of operation of the outputs. For each of the gates 51-55, as known to one skilled in the art, the output of the gate is a logic LOW only when both inputs to the gate are a logic HIGH. Gates 52 and 55, each having both inputs wired together, operate as inverters. Alternatively, inverter gates could be used for gates 52 and 55. Gates 52 and 55 are NAND gates in the preferred embodiment to achieve uniformity of the gates used in the circuit.

Resistor 21 provides for a transferring of the supply voltage at terminal 12 to node 20. Diode 35 clamps the voltage at node 20 so that it can go no higher than the regulated control voltage Vcc. A logic level is thus established at node 20, which is connected to the inputs of NAND gates 51 and 52.

In the first mode of operation, terminal 13 is the primary output, and the secondary output at terminal 14 is the complement of the primary output. The user would connect the positive supply voltage to terminal 12 and the negative to terminal 15 in order to establish this mode of operation. With the positive supply voltage at terminal 12, a logic HIGH is present at node 20. Gate 52 will receive the logic HIGH from node 20, and, consequently, the output of gate 52 will be a logic LOW. The logic LOW output of gate 52 is transmitted to an input of gate 53, and since the output of gate 52 will remain at a logic LOW, the output of gate 53 will remain at a logic HIGH level. As long as the positive supply voltage is at terminal 12, the output of gate 53 will never go low. Therefore, the Alarm Signal, the other input of gate 53, will have no effect on the output of gate 53. Consequently, the Alarm Signal will exert no control over the secondary output transistor 42.

In this complementary mode of operation, the HIGH logic level at node 20, which is an input to gate 51, allows the Sensor Signal 18 to control the secondary output transistor 42 through gates 51, 54, and 55. For example, when the Sensor Signal 18 is HIGH, a high voltage will turn on transistor 41 through resistor 22. The primary output will be ON. The HIGH Sensor Signal 18 will also cause a logic LOW level at the output of gate 55. The output of gate 51, with a LOW input, will be a logic HIGH. The output of gate 54, with both inputs HIGH, will be a logic LOW. The low voltage at the output of gate 54 will not be sufficient to turn on transistor 42. Transistor 42, controlling the complement output at terminal 14, will be OFF.

When the Sensor Signal 18 is LOW, transistor 41 is OFF. The output of gate 55 will be HIGH. The output of gate 51, with both inputs HIGH, will be a logic LOW. Gate 54, with a logic LOW input, will have a logic HIGH output. The high voltage at the output of gate 54 will provide sufficient base drive current through resistor 23 to turn on transistor 42. Therefore, when the primary output is OFF, the secondary (complementary) output controlled by transistor 42 will be ON.

In the second mode of operation, the secondary output at terminal 14 will be controlled by the Alarm Signal 19 or other signal not related to the Sensor Signal 18. The user establishes this mode of operation by reversing the polarity of the supply voltage so that the negative supply voltage is at terminal 12 and the positive is at terminal 15.

A negative supply voltage at terminal 12 will establish a logic LOW level at node 20. This logic LOW level, which is fed to the inputs of gates 51 and 52, will cause a logic HIGH level at the outputs of gates 51 and 52. As long as the negative supply voltage is present at terminal 12, the outputs of gates 51 and 52 will remain HIGH. Therefore, the Sensor Signal 18 will exert no control over the output of gate 51, and, consequently, the Sensor Signal 18 will not affect the secondary output transistor 42. Also, the Alarm Signal 19 will be able to directly control the secondary output transistor 42 through gates 53 and 54. For example, when the Alarm Signal 19 is HIGH, the output of gate 53, with both inputs HIGH, will be LOW. The output of gate 54, with a LOW input, will be HIGH and will turn on the secondary output transistor 42. Conversely, if the Alarm Signal 19 is LOW, the output of gate 54 will be LOW, and transistor 42 will be OFF.

The preferred embodiment shows an Alarm Signal as the signal unrelated to the Sensor Signal. An Alarm Signal would be a typical signal used in an application of the present invention in a sensor or control device. This signal is, however, selected by the user and could be any signal the user desires.

While the present invention has been described in connection with the preferred embodiment thereof, it will be understood that many modifications will be readily apparent to those skilled in the art, and this application is intended to cover any adaptations or variations thereof. It is manifestly intended that this invention be limited only by the claims and equivalents thereof.

What is claimed is:

1. A DC circuit, comprising:
   input means including first and second input terminals for supplying voltage to said circuit;
   output means responsive to first and second input signals for delivering at first and second output terminals either a first output signal and a complement of said first output signal in a first mode of operation, or said first output signal and a second output signal unrelated to said first output signal in a second mode of operation; and
   control means coupled to receive said first and second input signals, said input means, and said output means, said control means establishing said first mode of operation when said first input terminal is positive with respect to said second input terminal, and establishing said second mode of operation when said second input terminal is positive with respect to said first input terminal.

2. The circuit according to claim 1, wherein said control means comprises:
   a first transistor, said first transistor having a collector coupled to said first output terminal, an emitter, and a base;
   a second transistor, said second transistor having a collector coupled to said second output terminal, an emitter coupled to said emitter of said second transistor, and a base; and
   logic means for controlling said first and second transistors, said logic means coupled to said base of said first transistor, said base of said second transistor, said first input terminal, and coupled to receive said first and second input signals.

3. The circuit according to claim 2, wherein said logic means comprises:
   a first inverter, said first inverter having an input terminal coupled to said first input terminal of said input means, and an output terminal;
   a second inverter, said second inverter having an input terminal coupled to said base of said first transistor and coupled to receive said first input signal, and an output terminal;
   a first NAND gate, said first NAND gate having a first input terminal coupled to said input terminal of said first inverter, a second input terminal coupled to said output terminal of said second inverter, and an output terminal;
   a second NAND gate, said second NAND gate having a first input terminal coupled to receive said second input signal, a second input terminal coupled to said output terminal of said first inverter, and an output terminal; and
   a third NAND gate, said third NAND gate having a first input terminal coupled to said output terminal of said first NAND gate, a second input terminal coupled to said output terminal of said second NAND gate, and an output terminal coupled to said base of said second transistor.

4. A dual mode output circuit for a control device, comprising:
   terminal means for receiving:
      power terminal inputs;
      first and second signal inputs; and
      primary and secondary signal outputs; and
   control means connected to receive said power terminal inputs and said first and second signal inputs, and operative in a first mode selected by the application of a first polarity of power to said power terminal inputs to switch said primary and secondary signal outputs in complementary fashion to one another in response to a signal applied to said first signal input, and operative in a second mode selected by the application of a second polarity of power to said power terminal inputs to switch said primary signal output in response to a signal applied to said first signal input and to switch said secondary signal output in response to a signal applied to said second signal input.

* * * * *